US006779703B2

(12) United States Patent
Matsumoto et al.

(10) Patent No.: US 6,779,703 B2
(45) Date of Patent: Aug. 24, 2004

(54) METHOD AND DEVICE FOR PRESSING WORKPIECE

(75) Inventors: Seiki Matsumoto, Hiroshima-ken (JP); Shizuaki Okazaki, Hiroshima-ken (JP)

(73) Assignee: Kitagawa Seiki Kabushiki Kaisha, Hiroshima-ken (JP)

( * ) Notice: Subject to any disclaimer, the term of this patent is extended or adjusted under 35 U.S.C. 154(b) by 11 days.

(21) Appl. No.: 10/232,318

(22) Filed: Aug. 30, 2002

(65) Prior Publication Data

US 2003/0042294 A1 Mar. 6, 2003

(30) Foreign Application Priority Data

Aug. 31, 2001 (JP) ........................................ 2001-263911
Feb. 6, 2002 (JP) ........................................ 2002-029479
Apr. 25, 2002 (JP) ........................................ 2002-124290

(51) Int. Cl.[7] ............................................. B23K 31/02
(52) U.S. Cl. ........................................... 228/5.5; 228/8
(58) Field of Search ...................... 228/5.5, 106, 234.1, 228/235.1, 193, 194, 8

(56) References Cited

U.S. PATENT DOCUMENTS 4,049,184 A * 9/1977 Rozengart et al. .......... 228/131
4,216,874 A * 8/1980 Torisu ........................ 220/4.12
4,691,857 A * 9/1987 Friedman .................... 228/265
5,016,805 A * 5/1991 Cadwell ...................... 228/118
5,222,648 A * 6/1993 Takano ........................ 228/5.5
5,529,238 A * 6/1996 Feinberg et al. ............ 228/116
5,890,285 A * 4/1999 Pruitt et al. ............... 29/889.72
5,941,866 A * 8/1999 Niedospial, Jr. ............ 604/408
6,264,880 B1 * 7/2001 Elmer et al. ................ 264/572
6,630,249 B2 * 10/2003 Kennedy .................... 428/625
2003/0042294 A1 * 3/2003 Matsumoto et al. ........ 228/115

FOREIGN PATENT DOCUMENTS

EP        1293271 A2  *  3/2003

* cited by examiner

Primary Examiner—Kiley Stoner
(74) Attorney, Agent, or Firm—Pitney Hardin LLP

(57) ABSTRACT

A pressing device including a platen for pressing a workpiece is provided, which has a pressing plate provided between the platen and the workpiece to press the workpiece instead of the platen when the platen is moved toward the workpiece, and a liquid layer formed between the pressing plate and the platen to transfer a force for pressing the workpiece with a required pressure to the pressing plate from the platen through the liquid layer. The platen is a heating platen heatable to a temperature sufficient to heat the workpiece to a temperature required for pressing, and the liquid layer is filled with heat transfer oil. The pressing plate is metal plate with a mirror finished surfaces.

30 Claims, 12 Drawing Sheets

METHOD AND DEVICE FOR PRESSING WORKPIECE

BACKGROUND OF THE INVENTION

The invention relates to improved method and device for pressing a workpiece, and more particularly to method and device for heat-pressing a workpiece such as a multi-layered board by applying heat and pressure simultaneously thereto.

A multi-layered board such as printed wiring board (PWB) is generally manufactured by heat-pressing a plurality of vertically stacked members such as plurality of circuitry members and prepreg members inserted between the respective adjacent pair of circuitry members.

Heat-pressing is generally carried out by employing a pressing device having a pair of opposing heating platens, one of which is arranged to be driven toward and away from the other one.

Practically, a stack of circuitry members and prepreg members is prepared and placed between the pair of heating platens to be heat-pressed therebetween. During heat-pressing process, the temperature of the heating platens is controlled such that the resin component of the prepreg members is substantially liquidized for a predetermined period of time to thereby bond the adjacent circuitry members and unite all the stacked members together to form a multi-layered printed wiring board.

As a printed wiring board manufactured as above is required to have uniform thickness, heat-pressing must be carried out with heating platens having high surface flatness. On the other hand, a printed wiring board is recently becoming thinner and thinner due to the demand for producing compact electric devices in which a printed wiring board is to be installed. For example, the thickness of a printed wiring board to be manufactured is less than $100\,\mu m$, and in this case, a heating platen must have the surface flatness variation of less than $10\,\mu m$.

If the surfaces of the heating platens do not satisfy the condition mentioned above and have relatively large undulation, the pressure exerted from the heating platens on the printed wiring board varies across the printed wiring board. Such variance in the pressure results in thickness variance of the pressed printed wiring board. In addition, poor bonding property between the circuitry members occurs at locations where the pressure was insufficiently applied.

In addition to the above, pressing devices have recently employed large heating platens in order to simultaneously press a plurality of printed wiring boards by one pressing operation. However, since the realization of the required flatness of the heating platens becomes more difficult with the size thereof, the number of defective printed wiring boards, i.e. boards having low thickness uniformity and/or poor bonding property, also increases.

In order to avoid the above defects, it has been proposed to employ a cushion member, to be placed between a workpiece and a heating platen, such as a kraft paper that has a small surface roughness and small deformation on one side of which hardly affects the surface roughness of the other side.

Materials used in such a cushion member, however, have extremely low thermal conductivity compared to the heating platen. Such low thermal conductivity requires longer heating time and results in low productivity.

SUMMARY OF THE INVENTION

It is therefore an object of the invention to provide improved method and device for pressing a workpiece capable of applying uniform pressure over a workpiece irrespective the level of flatness of a pressing surface.

It is another object of the invention to provide improved method and device for pressing a workpiece capable of applying uniform pressure over a workpiece irrespective the size of a pressing surface.

It is a further object of the invention to provide improved method and device for heat-pressing a workpiece capable of applying uniform pressure over a workpiece as well as of effectively heating a workpiece.

According to an aspect of the invention, a method for pressing a workpiece with a uniform pressure across the workpiece is provided. In this method, a pressing plate is located on the pressing surface of a platen. Then a spacer thicker or deeper than the workpiece is placed beside the workpiece. The spacer is pressed by the platen to define a gap between the pressing plate and the workpiece. Then, a liquid layer formed between the platen and the pressing plate is pressurized such that the pressing plate bends toward the workpiece due to the pressure of the liquid layer and thereby presses the workpiece. Since the liquid layer exerts a uniform pressure over the pressing plate, the pressing plate applies a uniform pressure over the workpiece.

Thus, the platen can keep contacting the spacer and the distance between the platen and the workpiece remains constant while the liquid is being pressurized, which prevents the pressing plate from breaking due to too much bending toward the workpiece.

According to another aspect of the invention, a pressing method is provided in which a workpiece to be pressed is located on the pressing surface of the platen and a cushion member is provided between the platen and the workpiece. The cushion member includes a pair of plates joined to each other to form a sealed space therebetween. The sealed space is filled with liquid to form a liquid layer.

Then, the platen is forced towards the workpiece such that the workpiece is pressed by the cushion member. Since the cushion member is filled with liquid, the cushion member applies a uniform pressure across the workpiece.

Optionally, an intermediate plate may be provided between the cushion member and the workpiece before the workpiece is pressed by the cushion member. The intermediate plate may be bendable along the surface of the workpiece when the intermediate plate is pressed against the workpiece.

Alternatively, a stack of workpiece may be formed by alternatively pilling a plurality of the workpieces and the intermediate plates and placed the pressing surface of the platen for pressing.

The intermediate plates mentioned above assists in enlarging the area that the cushion member can exert uniform pressure on the workpiece.

According to another aspect of the invention, there is provided a device for pressing a workpiece, which has a platen movable towards the workpiece and a pressing plate provided between the platen and the workpiece such that the workpiece is pressed by the pressing plate when the platen is moved toward the workpiece.

A liquid layer is formed between the pressing plate and the platen. This liquid layer transfers the force for pressing the workpiece from the platen to the pressing plate. During the transmission of the force, the force exerted on the liquid layer from the platen is changed to a constant pressure of the liquid layer irrespective the surface geometry of the platen. Therefore, the force exerted on the pressing plate by the liquid layer is constant across the pressing plate and, as a result, the pressure applied on the workpiece from the pressing plate becomes uniform all over the workpiece.

The pressing plate is a thin plate so that it bends along the surface of the workpiece during pressing. Optionally, the workpiece side of the pressing plate is finished in a mirror-smooth state for smooth contact between the pressing plate and the workpiece.

In some cases, the platen is a heating platen heated to a temperature sufficient to heat the workpiece to a temperature required for heat-pressing. In such case, the liquid layer is preferably a layer of heat conductivity oil. Since the heat transfer oil has high heat conductivity, the heat of the heating platen is effectively transferred to the workpiece. Therefore the workpiece can be heated in a short time and thus the time required for the whole pressing process is reduced.

Optionally, the pressing plate is detachably mounted to the platen such that a space is defined therebetween. The space is utilized to form the liquid layer by filling the space with liquid. The pressure of the liquid filled in the space is preferably controlled by a pressure controller such that, for example, the pressure of the liquid is raised only when the workpiece is pressed.

In the above case, the press may further include a spacer for keeping the distance between the workpiece and the platen during the pressing. The spacer is arranged to the workpiece side of the platen and sustains the platen forced towards the workpiece such that a clearance is defined between the pressing plate and the workpiece when the liquid layer is not pressurized. The clearance is defined to have a size small enough to allow the pressing plate to bend by the liquid layer and press the workpiece when the liquid layer is pressurized.

The pressure controller raises the pressure of the liquid such that the pressing plate bends and presses the workpiece only when the platen is sustained by the spacer. Further, the pressure controller raises the pressure of the liquid up to a predetermined level that is not greater than the maximum pressure the platen can apply. The pressing plate bends towards the workpiece when the liquid is pressurized. However, as long as the conditions mentioned above are satisfied, the bend of the pressing plate is restricted to a small degree due to the small clearance and the breakage of the pressing plate caused by high pressure of the liquid layer is prevented.

In some cases, the pressing device includes a pressure controller adapted to control the pressure of the liquid layer, and a backing plate joined to the pressing plate such that a space is defined therebetween. The space is filled with liquid to form the liquid layer. The backing plate is detachably mounted to the platen so that it can be exchanged together with the pressing plate joined thereto. The backing plate includes a conduit that is in communication with the space and an opening formed at a side surface of the backing plate. The opening is connected to the pressure controller so that the pressure of the liquid layer can be controlled.

In the above case, the pressing device may be configured such that the space is formed when the liquid is pressurized to a predetermined level, while the space disappears and the pressing plate becomes in contact with the backing plate when the pressure of the liquid is reduced below the predetermined level.

Optionally, a groove may be formed to the backing plate at the surface facing the pressing plate, which is in communication with the conduit to provide the liquid into the groove. The groove may be formed in a grid pattern extending over the surface of the backing plate so that the liquid quickly spreads over the backing plate and the liquid layer is formed in a short time after the liquid layer is pressurized.

Where the platen is a heating platen, the backing plate is mounted to the platen such that the surface facing the platen is in contact therewith so that the heat of the heating platen is efficiently conducted to the workpiece.

In some cases, the pressing device includes a pair of the platens, a pair of the pressing plates, and a pair of the liquid layers. The platens, pressing plates and liquid layers are arranged to sandwich and press the workpiece between the pair of pressing plates so that a uniform pressure can be applied over both sides of the workpiece.

In some cases, the pressing device comprises a cushion member which carries the pressing plate and an additional plate. The additional plate and the pressing plate are joined to each other to define a sealed space therebetween. The sealed space is filled with liquid to form the liquid layer. The cushion member is located between the platen and the workpiece such that the additional plate faces the platen and the pressing plate faces the workpiece. During the press, pressure is applied from the platen to the workpiece through the cushion member. Since the cushion member includes the liquid layer, uniform pressure is applied across the workpiece even if the surface flatness of the platen is relatively low.

Where the platen is a heating platen, the sealed space of the cushion member is filled with heat transfer oil so that the heat of the heating platen is efficiently conducted to the workpiece during the press.

In the above case, it is preferable to form the pressing plate and the additional plate from a material of high heat conductivity such as metal. It is also preferable that the workpiece side of the pressing plate is of a mirror finished surface so that the pressing plate does not scratch the workpiece during pressing.

The sealed space may be formed by welding the pressing plate and the additional plate along the entire peripheries thereof.

Alternatively, the cushion member may include a spacer located between the pressing plate and the additional plate to keep the pressing plate substantially flat and thereby increase the area that can be utilized to press the workpiece. The spacer may also serve to keep the additional plate substantially flat. The spacer may further serve to keep the pressing plate and the additional plate substantially parallel to each other. The spacer above may be an annular member having an upper rim and a lower rim. The upper and lower rims may be respectively welded to the pressing plate and the additional plate to form the sealed space.

The pressing device of the above mentioned case may include a pair of the above described platens, and a pair of the above described cushion members. These platens and cushion members may be arranged to sandwich and press the workpiece between the pair of cushion members.

Optionally, the press may include a flat intermediate plate. During pressing of the workpiece, the intermediate plate is located to one of first and second places, where the first place is defined between the workpiece and the cushion member and the second place is defined between two workpieces stacked to be pressed simultaneously. Such intermediate plate located to the first or second place assists in applying uniform pressure to the workpiece.

Preferably, the intermediate plate is thin enough to bend along the surface of the workpiece when it presses the workpiece. The intermediate plate is preferably made of a material of high heat conductivity such as metal.

BRIEF DESCRIPTION OF THE ACCOMPANYING DRAWINGS

Examples of the present invention will now be described, with reference to the accompanying drawings, in which:

FIG. 1 schematically shows a configuration of a press of a first embodiment of the invention;

Figure 5:
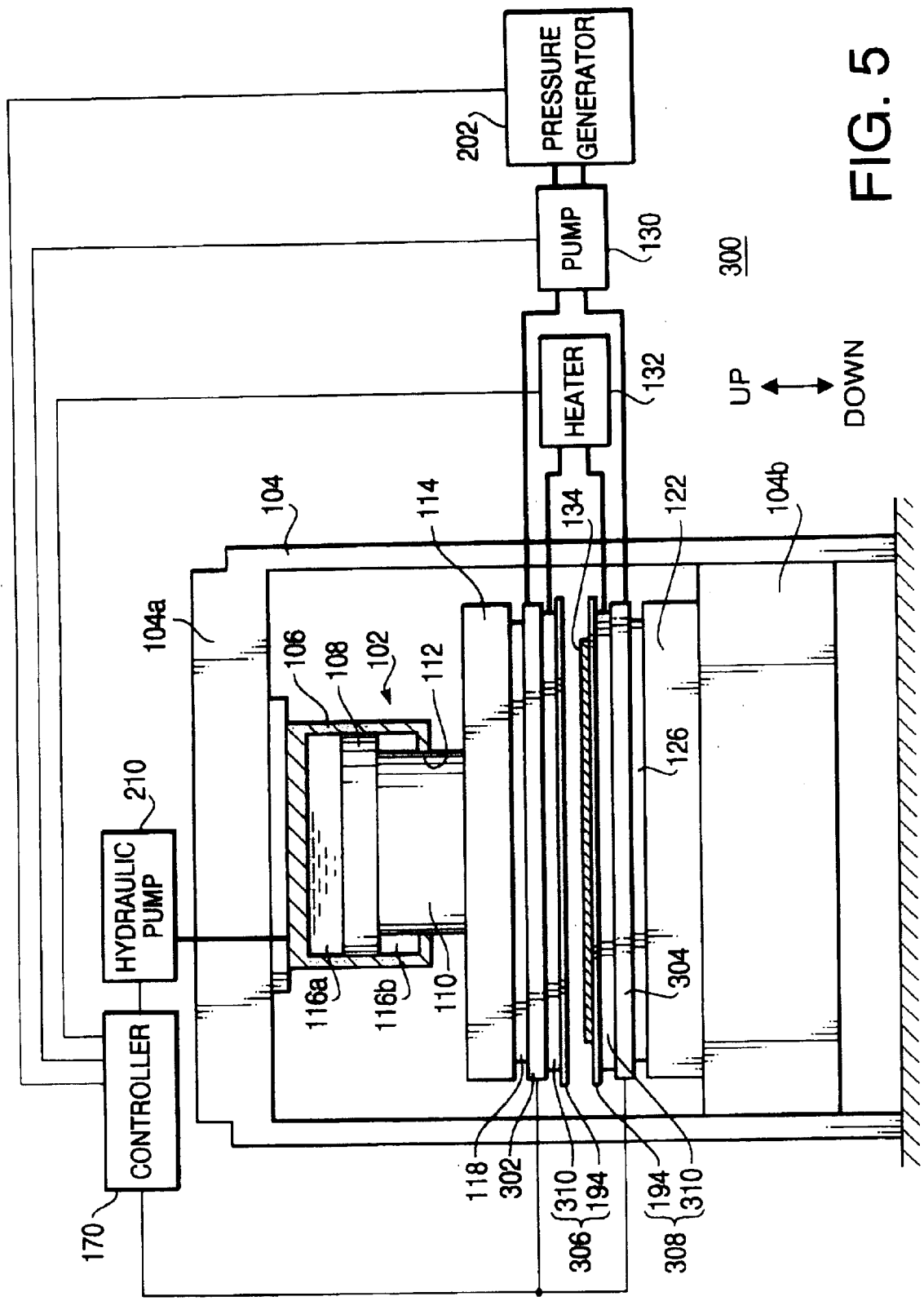
Figure 6:
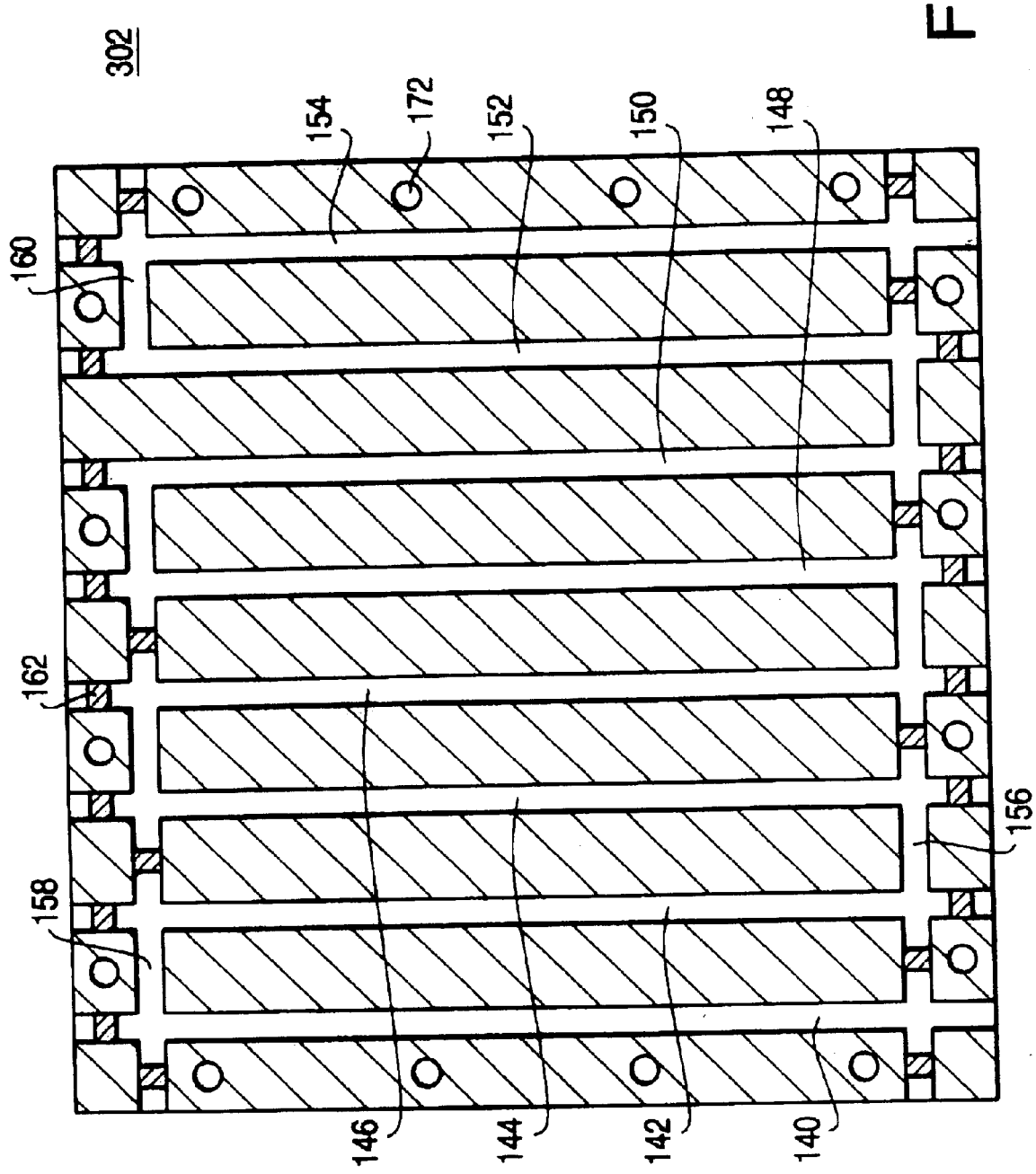
Figure 7:
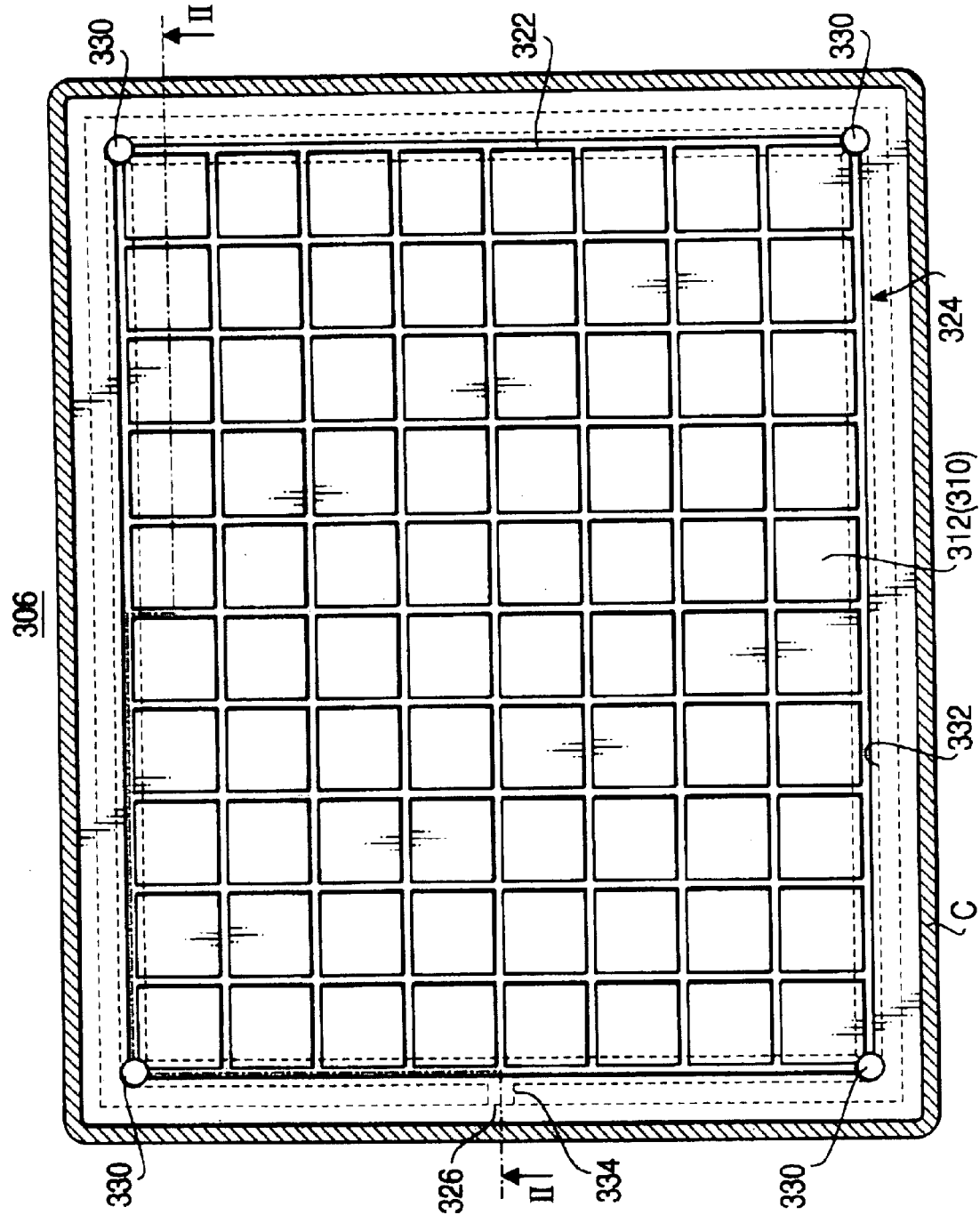
Figure 8:
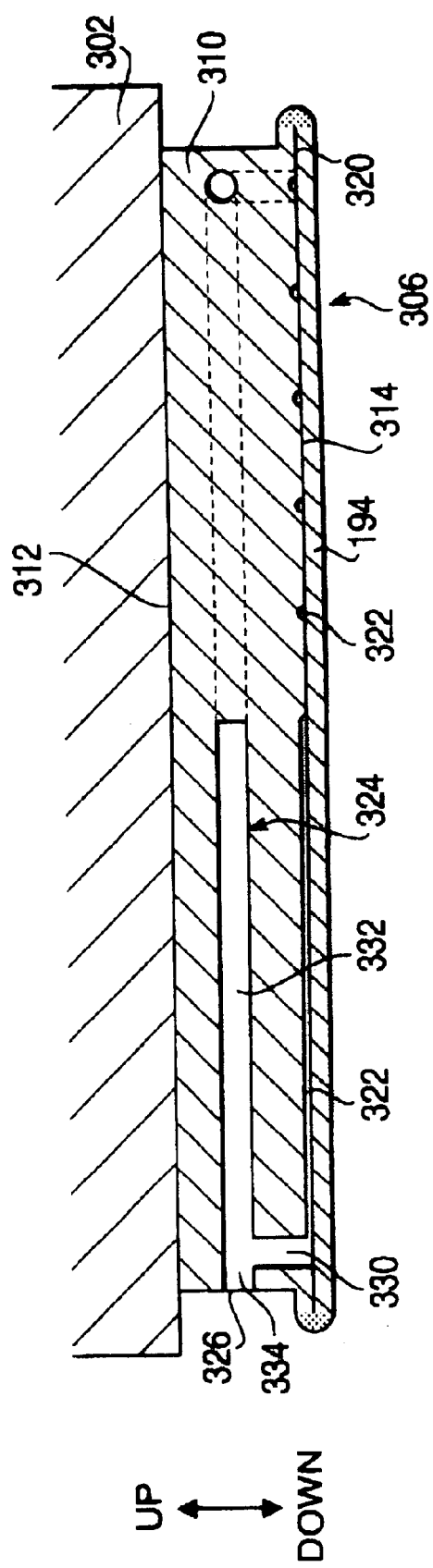
Figure 9:
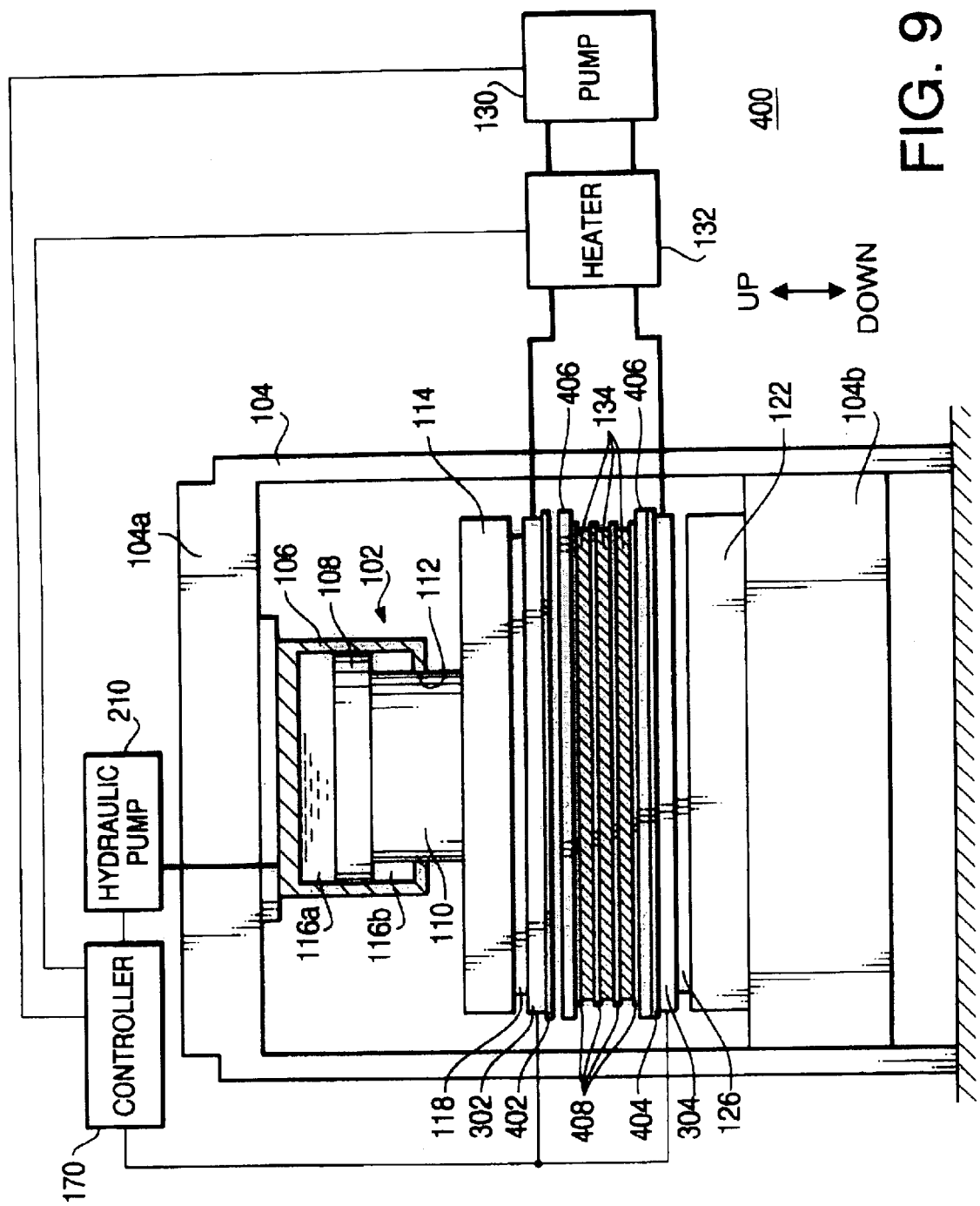
Figure 10:
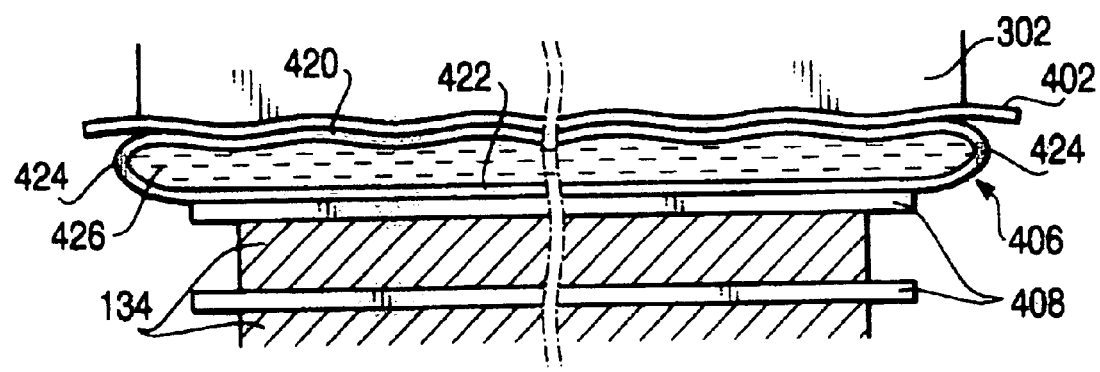
Figure 11:
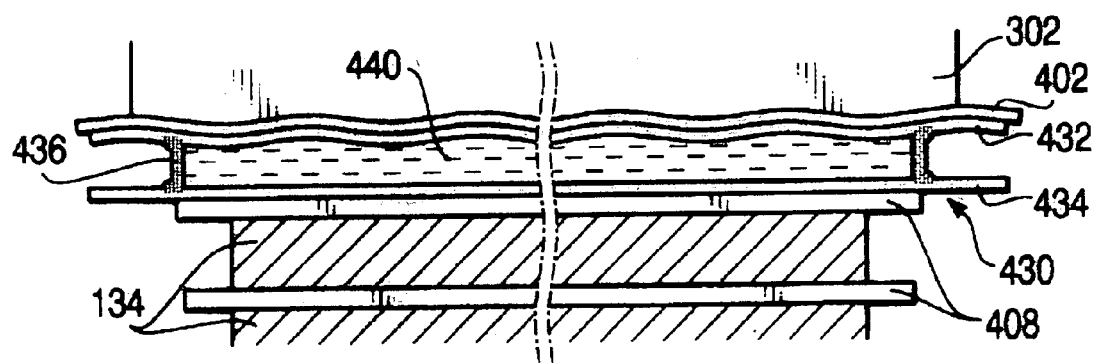

FIG. 5 schematically shows a configuration of a press of the second embodiment of the invention;

FIG. 6 is a horizontal sectional view of an upper heating platen of the press shown in FIG. 5;

FIG. 7 shows a horizontal sectional view of an upper platen cover of the press shown in FIG. 5;

FIG. 8 shows a vertical sectional view of the upper platen cover mounted to the upper heating platen, taken along a line II—II in FIG. 7;

FIG. 9 schematically shows the configuration of a press of a third embodiment of the invention;

FIG. 10 is a vertical sectional view of a part of the press of FIG. 9 showing a cushion member pressing a stack of printed wiring boards; and FIG. 11 is a vertical sectional view of a part of the press of FIG. 10 showing a cushion member which is a variation of the cushion member shown in FIG. 10.

DETAILED DESCRIPTION OF THE EMBODIMENTS

Hereinafter, the embodiments of the invention will be described with reference to the accompanying drawings.
(First Embodiment)

Figure 1:
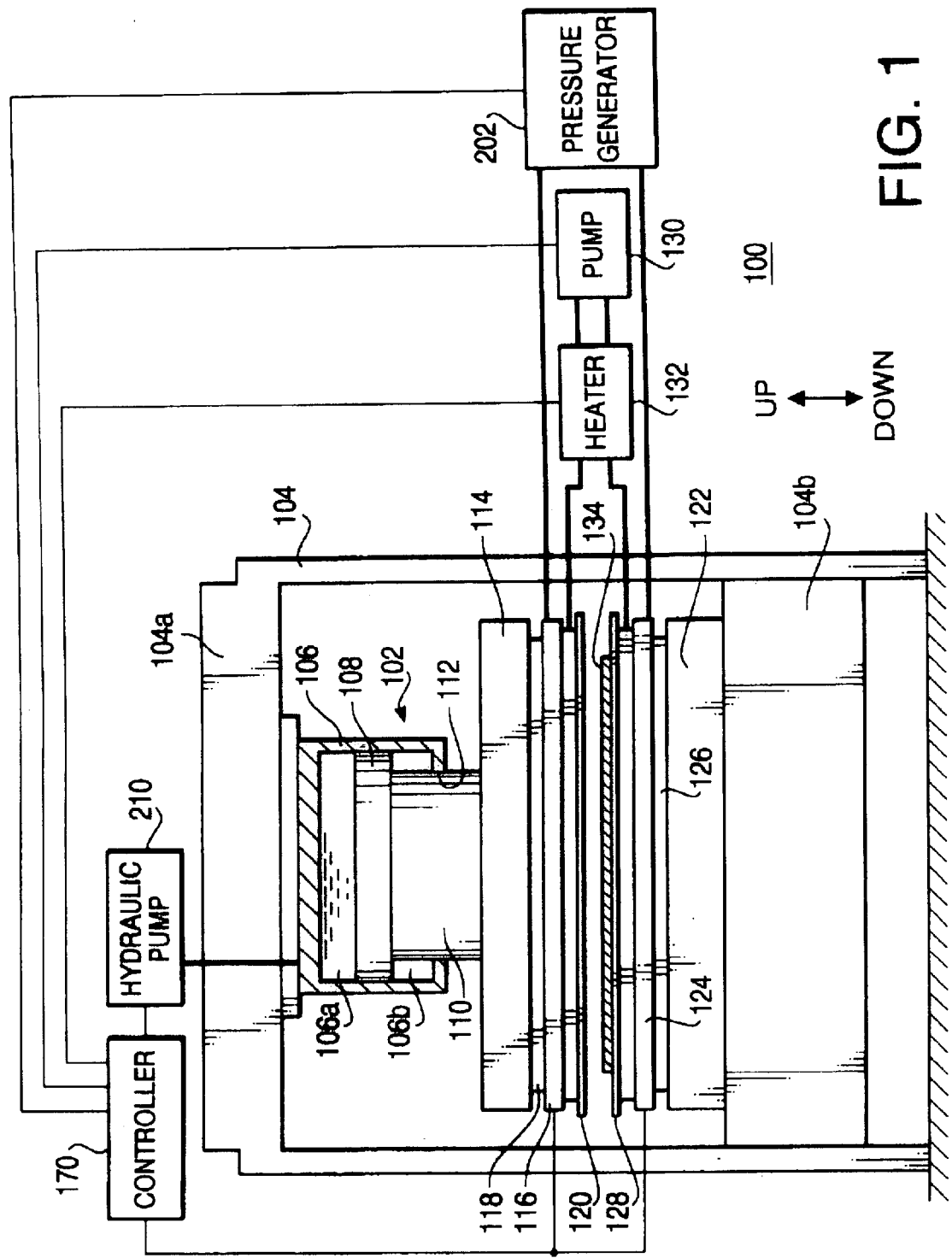

FIG. 1 schematically shows the configuration of a pressing device 100 according to a first embodiment of the invention.

The pressing device 100 has a piston-cylinder mechanism 102 mounted to a ceiling 104a of a frame 104. The piston-cylinder mechanism 102 includes a cylinder 106 and a piston 108 located within the cylinder 106 to slide up and down along the inner wall of the cylinder 106. A through hole 112 is bored at the bottom of the cylinder 106. A piston rod 110 is mounted to the bottom of the piston 108 to move up and down together with the piston 108.

The inner space of the cylinder 106 is divided into an upper space 106a and a lower space 106b by the piston 108. Both upper and lower spaces 106a, 106b are filled with hydraulic oil. The upper and lower spaces 106a, 106b are connected to a hydraulic pump 210 which actuates under the control of a controller 170. The hydraulic pump 210 increases the pressure of the hydraulic oil in one of the upper and lower spaces 106a, 106b while decreasing the pressure of the other one to move the piston 108 up and down.

A moving table 114 is fixed to the lower end of the piston rod 110 to be moved up and down by the force generated by the piston cylinder mechanism 102. An upper heating platen 116 is further fixed to the undersurface of the moving table 114 with a heat insulator 118 provided therebetween. The heat insulator 118 prevents heat loss of the upper heating platen 116 due to heat conduction from the upper heating platen 116 towards the moving table 114. The undersurface of the heating platen 116 is covered with an upper platen cover 120.

A fixed table 122 is settled on a base 104b of the frame 104, and a lower heating platen 124 is mounted on the fixed table 122 with a heat insulator 126 for preventing heat loss of the lower heating platen 124 therebetween. The top surface of the lower heating platen 124 is covered with a lower platen cover 128.

One or more workpieces, such as printed wiring boards, copper clad laminates or the like may be placed on the lower platen cover 128 for pressing. In the present embodiment, one printed wiring board 134 having two layers of circuitry and one layer of prepreg provided therebetween is placed on the lower platen cover 128. The thickness of the circuitry layer and the prepreg layer are 18 $\mu$m and 50 $\mu$m, respectively. Accordingly, the total thickness of the printed wiring board 134 is 86 $\mu$m.

The upper and lower heating platens 116, 124 are connected to a pump 130 that provides a heating medium such as a heat transfer oil into a conduit formed in each heating platen (116, 124) as will be described later. A heater 132 is provided between the pump 130 and the two platens 116, 124 to heat the heat transfer oil.

The heat transfer oil provided from the pump 130 is heated by the heater 132 and then flows through the upper and lower heating platens 116, 124. In this manner, the upper and lower heating platens 116, 124 are heated to a predetermined forming temperature which is required for heating the prepreg of the printed wiring board 134 up to a temperature at which the prepreg becomes substantially liquid.

If the moving plate 114, and therefore the upper heating platen 116 fixed thereto, are forced downwards by the piston-cylinder mechanism 102, the printed wiring board 134 placed on the lower platen cover 128 is sandwiched between the upper and lower platen covers 120, 128. The sandwiched printed wiring board 134 is both heated and pressed by the upper and lower platen covers 120, 128. As a result, the circuitry layers are firmly bonded by the prepreg layer and the printed wiring board 134 is formed into a uniform thickness.

Figure 2:
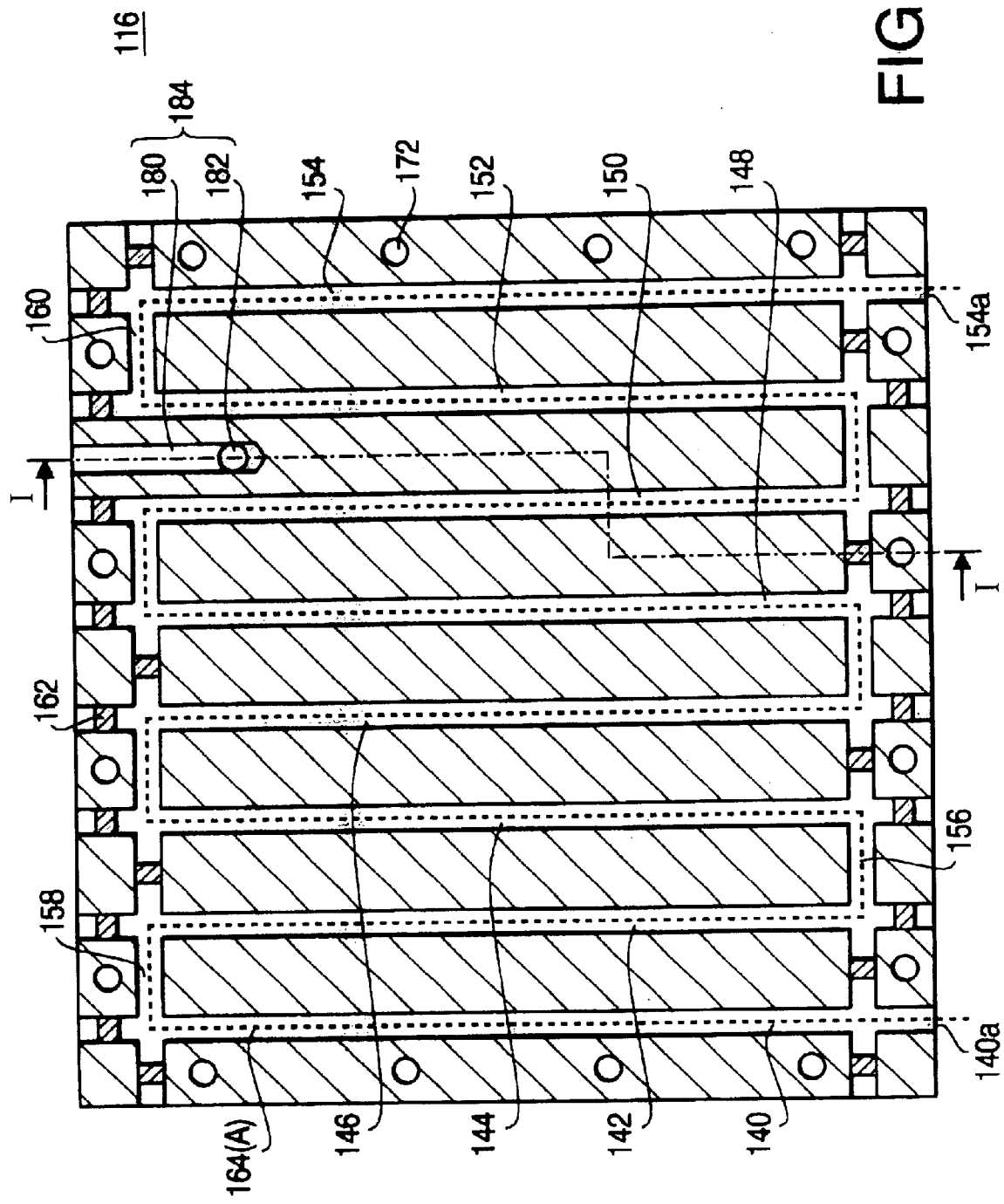
FIG. 2 shows a horizontal sectional view of an upper heating platen of the press shown in FIG. 1.

FIG. 2 shows a horizontal sectional view of the upper heating platen 116. The upper heating platen 116 is a thick plate made of steel and having an essentially square shape. First through eleventh through holes 140–160 are formed in the upper heating platen 116.

The first through eighth through holes 140–154 are formed in parallel with each other in up and down direction in FIG. 2. On the other hand, the ninth through eleventh through holes 156–160 are formed in a lateral direction in FIG. 2. In particular, the ninth through hole 156 is formed near the lower end of the upper heating platen 116 in FIG. 2 so that it intersects with each of the first though eighth through holes 140–154 at a right angle. Further, the tenth through hole 158 is bored near the top end of the upper heating platen 116 from the left side up to the sixth through hole 150. The eleventh through hole 160 is also bored near the top end of the upper heating platen 116 from the right side up to the seventh through hole 152.

A plurality of blank caps 162 are filled into the through holes 140–160 so that a single heating conduit 164 is formed within the upper heating platen 116, which starts at one end 140a of the first through hole 140, meanders through the upper heating platen 116, and ends at one end 154a of the eighth through hole 154 as indicated with a broken line A in FIG. 2.

The heat transfer oil provided from the pump 130 flows through the heating conduit 164 to heat the upper heating platen 116. The upper heating platen 116 is provided with a thermal sensor (not shown) which is connected with the controller 170 (see FIG. 1). The controller 170 controls the heater 132 based on the temperature detected by the thermal sensor to adjust the temperature of the heat transfer oil flowing through the heating conduit 164 such that the upper heating platen 116 is heated to the predetermined forming temperature of the prepreg, e.g. 200° in this embodiment.

A plurality of through holes 172 are formed to the periphery of the upper heating platen 116 in a direction perpendicular to FIG. 2. The upper platen cover 120 is mounted to the undersurface of the upper heating platen 116 by means of bolts inserted through the through holes 172 as will be described later.

The upper heating platen 116 is further provided with two holes 180 and 182. The hole 180 is bored between the sixth through hole 150 and the seventh through hole 152 from the upper end of the upper heating platen 116 in FIG. 2 in parallel with the sixth through hole 150. The hole 182 is bored from the undersurface of the upper heating platen 116 so that it runs into the hole 180 at a right angle. The two holes 180 and 182 constitute a pressure conduit 184 that extends from the side surface to the undersurface of the upper heating platen 116.

Figure 3:
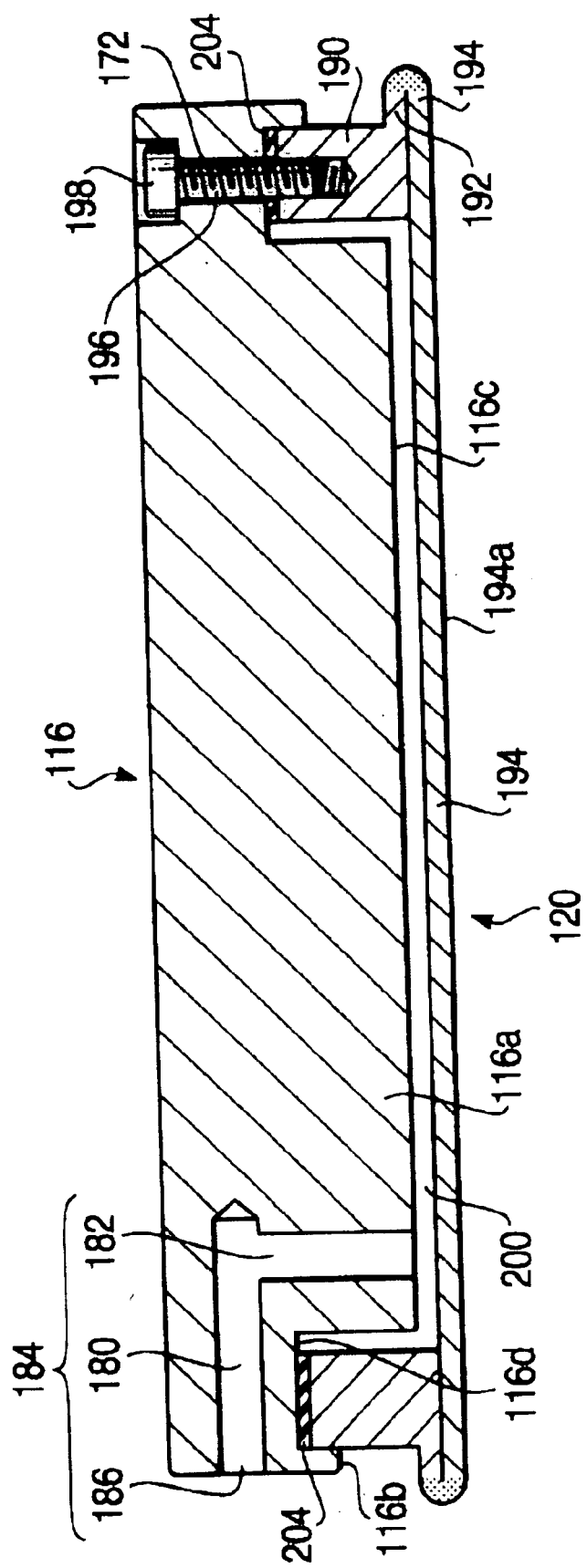
FIG. 3 is a sectional view of the upper hot plate and an upper platen cover fastened thereto, taken along a line I—I in FIG. 2.

FIG. 3 is a sectional view of the upper heating platen 116 and the upper platen cover 120 fastened thereto, taken along a line I—I in FIG. 2.

The upper platen cover 120 includes a rectangular annular frame 190 and a metal plate 194. Both of the frame 190 and the metal plate 194 are made of a material having high heat conductivity.

The frame 190 has a flange 192 formed around the outer periphery in the vicinity of the bottom. The flange 192 extends outwardly from the frame 190 substantially parallel to the undersurface of the frame 190. The metal plate 194 is a thin sheet made of stainless steel having mirror smooth surfaces.

The metal plate 194 and the flange 192 are welded to each other along their entire periphery in a water tight manner. Thus, the metal plate 194 and the frame 190 are integrated into one piece.

The frame 190 has a plurality of screw holes 196 bored vertically from the upper surface (only one is shown in FIG. 3). These screw holes 196 are formed for fastening the upper platen cover 120 to the upper heating platen 116 by means of bolts 198 as will be described later.

The upper heating platen 116 has a protrusion 116a at its bottom and a shoulder portion 116b surrounding the protrusion 116a. The protrusion 116a is formed such that it loosely fits into the frame 190 of the upper platen cover 120. The protrusion 116a can be inserted until the top surface of the frame 190 abuts the shoulder portion 116b of the upper heating platen 116. The shoulder portion 116b restricts the length of the protrusion 116a inserted into the frame 190 to form a space 200 between the undersurface 116c of the upper heating platen 116 and the metal plate 194.

A groove 116d is formed to the shoulder portion 116b into which the upper portion of the frame 190 fits. By fitting the frame 190 into the groove 116d, the relative position between the frame 190 and the upper heating platen 116 is adjusted such that each through hole 172 of the upper heating platen 116 aligns with a respective screw hole 196 of the frame 190. Thus, the upper platen cover 120 can be fastened to the upper heating platen 116 by inserting the bolt 198 to each of the through holes 172 and screw into the respective screw hole 196.

The space 200 formed between the undersurface 116c, or the pressing surface, of the upper heating platen 116 and the metal plate 194 is in communication with the pressure conduit 184. The space 200 and the pressure conduit 184 are filled with heat transfer oil to transmit the heat from the upper heating platen 116 to the metal plate 194. Since the heat transfer oil has high thermal conductivity, the temperature of the metal plate 194 becomes substantially same as that of the upper heating platen 116.

One end 186 of the pressure conduit 184 is connected to a pressure generator 202 (see FIG. 1) which changes the pressure of the heat transfer oil filling the space 200 under the control of the controller 170. A packing 204 is provided between top surface of the frame 190 and the groove 116d of the upper heating platen 116 to prevent the heat transfer oil from leaking out from the space 200 even if the pressure generator 202 has pressurized the heat transfer oil therein.

It should be noted that the lower heating platen 124 and the lower platen cover 128 have substantially same structures and functions as that of the upper heating platen 116 and the upper platen cover 120, respectively. Therefore the above description related to the upper heating platen 116 and the upper platen cover 120 applies also to the lower heating platen 124 and the lower platen cover 128.

Hereinafter, the procedure to press the printed wiring board 134 by the pressing device 100 will be described by referring to FIG. 4A through 4C.

Figure 4A:
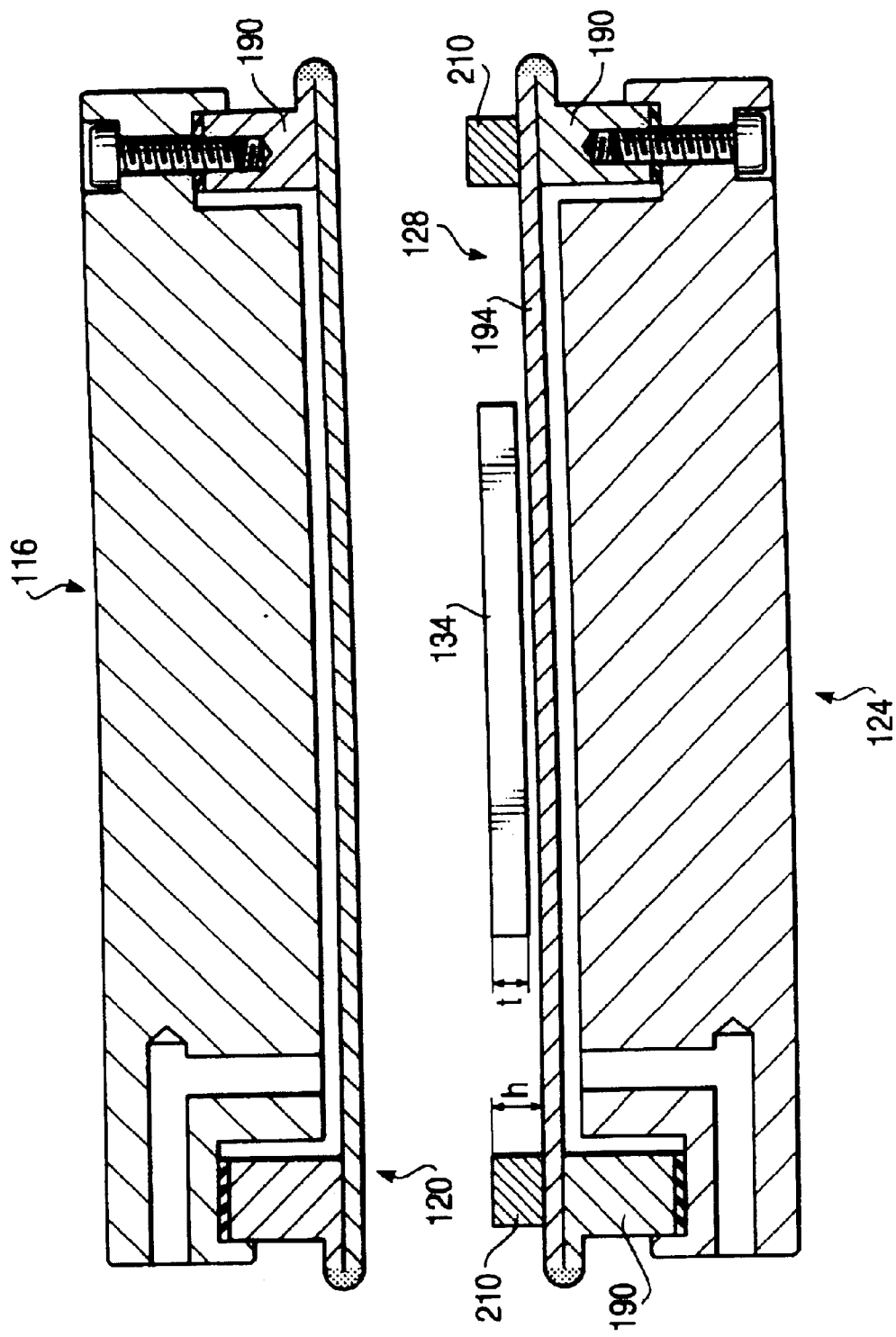
FIGS. 4A through 4C shows a procedure to press a printed wiring board by the press shown in FIG. 1.
Figure 4B:
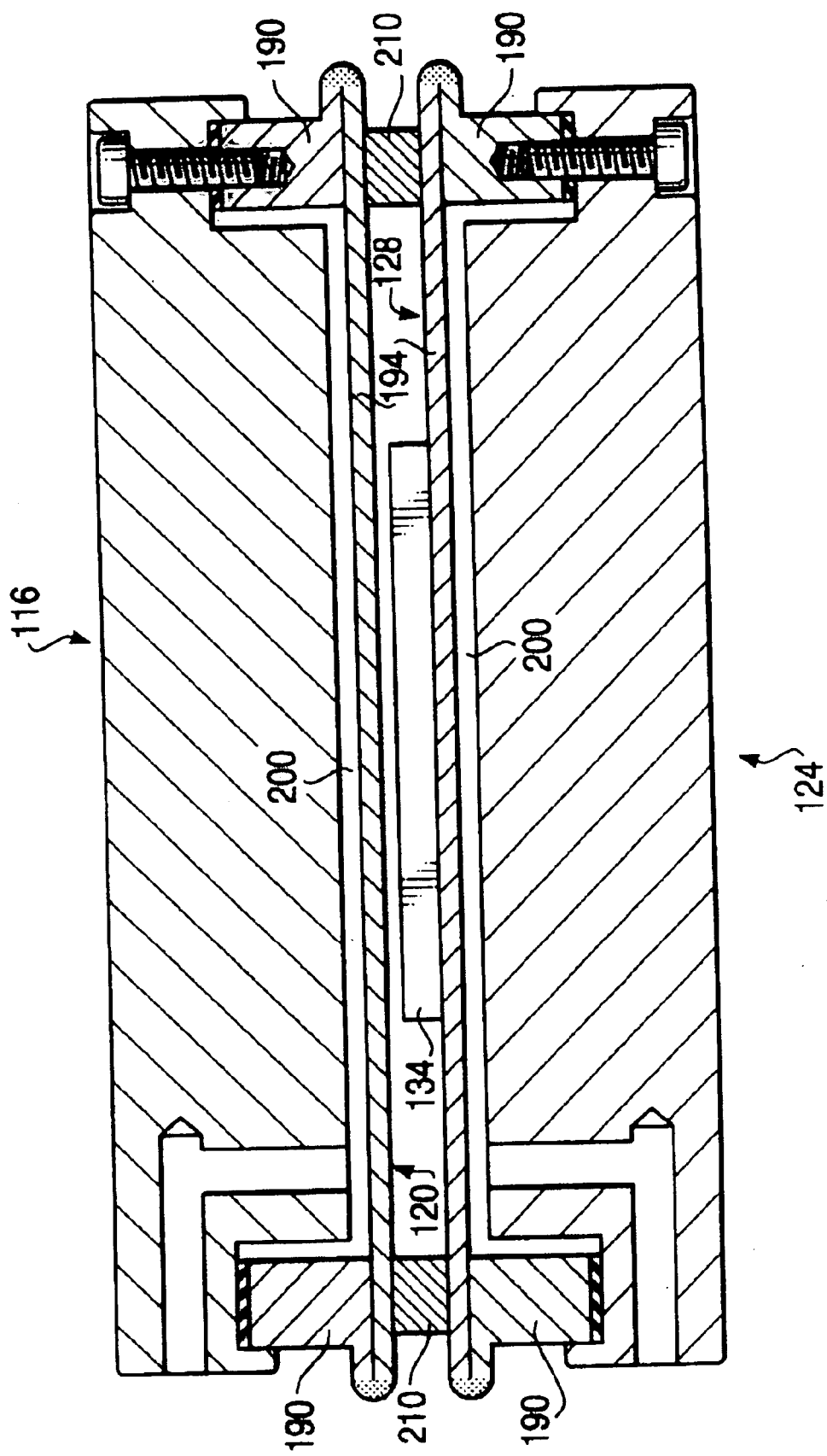

First, as shown in FIG. 4A, one or more spacers 210 are placed on the metal plate 194 of the lower platen cover 128 at a location above the frame 190. The spacers have a height h which is slightly larger than the thickness t of the printed wiring board 134.

Next, the pump 130 and the heater 132 of the pressing device 100 are actuated so that hot oil flows through the heating conduits 164 formed in the upper and lower heating platens 116 and 124. The temperature of the heat transfer oil is controlled so that the temperatures of the upper and lower heating platens 116, 124 are kept at the predetermined forming temperature.

The heat of the upper heating platen 116 is transmitted by the heat transfer oil filled in the space 200 to the upper platen cover 120. Therefore, the upper platen cover 120 is also heated to the forming temperature. The lower platen cover 128 mounted to the lower heating platen 124 is also heated in the same manner as described above.

The temperature of each of the upper and lower heating platens 116 and 124 is measured by the temperature sensors (not shown) provided therein. After it is confirmed that the upper and lower heating platens 116 and 124 are heated to the predetermined forming temperature, the printed wiring board 132 is placed on the lower platen cover 128.

Next, the piston-cylinder mechanism 102 is actuated to force the upper heating platen 116 and the upper platen cover 120 mounted thereto towards the printed wiring board 134. As a result, the upper heating platen 116 and the upper platen cover 120 moves until the upper platen cover 120 presses the spacers 210, as shown in FIG. 4B.

The spacers 210 abut the upper platen cover 120 at the frame 190, and thereby support and sustain the upper platen cover, and also the upper heating platen 116, such that a clearance is formed between the printed wiring board 134 and the metal plate 194 of the upper platen cover 120.

Next, the heat transfer oil filled between the upper heating platen 130 and the upper platen cover 140 and also the heat transfer oil filled between the lower heating platen 124 and the lower platen cover 128 are pressurized to a predetermined level by the pressure generator 202. The predetermined level is not greater than the maximum pressure that the heating platen can apply. Therefore, the pressurized heat transfer oil never pushes the heating platen away from the spacer(s).

Figure 4C:
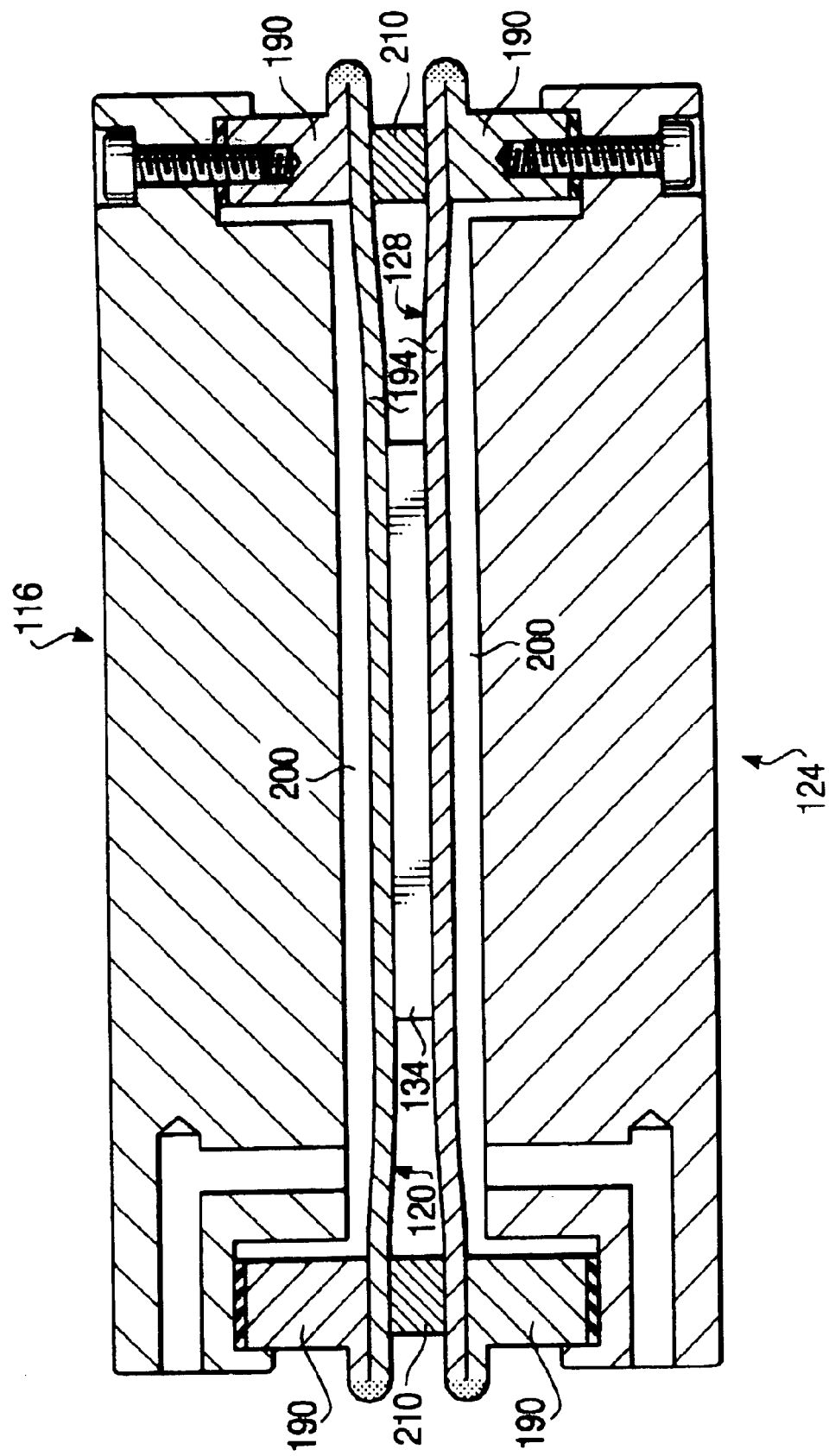

As the heat transfer oil is pressurized, the metal plates 194 of both of the upper and lover platen covers 120, 128 slightly bend towards the printed wiring board 134, as shown in FIG. 4C. The bend of each metal plates 194, however, is limited by the distance between the upper and lower heating platens 116, 124 that are pressing the spacer 210. Therefore, the metal plates 194 do not break due to excessive bending.

The two metal plates 194, that have bent, sandwich and press the printed wiring board 134. The metal plates 194, which are formed from thin metal sheets, bend along the surface of the printed wiring board 134 due to the pressure of the heat transfer oil and thereby apply uniform pressure all over the printed wiring board 134. In addition, since both sides of the printed wiring board 134 is pressed with same and uniform pressure, the printed wiring board 134, and also the metal plates 194 pressing the printed wiring board, becomes substantially flat during the pressing process.

Further, since the metal plates 194 have mirror smooth surfaces, they do not forms any flaw on the printed wiring board 134 during pressing.

The pressing device 100 keeps the above state for a time sufficient for bonding the circuitry layers by the prepreg layer. Then, the pressure generator 202 reduces the pressure of the heat transfer oil between the upper/lower heating platen (116, 124) and the upper/lower platen cover (120, 128). As a result, the metal plates 194 returns to a substantially flat state as shown in FIG. 4B. Next, the moving table 114 is driven upwards to move the upper platen cover 120 away from the lower platen cover 128 so that the printed wiring board 134 can be removed.

As above, the heat transfer oil filled between the upper/lower heating platen (116, 124) and the upper/lower platen cover (120, 128) is pressurized to the predetermined level after the upper heating platen 116 is pressed against the spacers 210 to define the small clearance between the printed wiring board 134 and the metal plate 194 of the upper heating platen 116. In this way, the pressing device 100 according to the present embodiment prevents the metal plates 194 of the upper and lower platen covers 120, 128 from bending too much and breaking due to applying high pressure to the heat transfer oil.

(Second Embodiment)

Hereinafter, a pressing device according to a second embodiment of the invention will be described. It should be noted that in this and the following embodiments, elements that are substantially same as those described in the first embodiment are denoted by the same reference numbers.

FIG. 5 schematically shows the configuration of a pressing device 300 according to the second embodiment of the invention. The structure, and also the operation procedure, of the pressing device 300 according to the second embodiment of the invention is same as that of the pressing device 100 according to the first embodiment except the structures of the upper and lower heating platens 302, 304 and the upper and lower platen covers 306, 308. In particular, the upper and lower platen covers 306, 308 differ from those of the first embodiment in that they include a backing plate 310 instead of the frame 190.

FIG. 6 is a horizontal sectional view of the upper heating platen 302 of the pressing device 300 shown in FIG. 5. The upper heating platen 302 of FIG. 6 differs from the upper heating platen 116 of FIG. 2 in that it does not have any conduit corresponding to the pressure conduit 184. Apart from the above, the structure of the upper heating platen 302 of FIG. 5 is same as that of the upper heating platen 116 of FIG. 2.

FIG. 7 is a horizontal sectional view of the upper platen cover 306 showing the undersurface of the backing plate 310, and FIG. 8 is a vertical sectional view of the upper platen cover 306 mounted to the upper heating platen 302, taken along a line II—II in FIG. 7.

As can be seen in FIG. 8, the backing plate 310 is a thick metal plate having a top surface 312 and an undersurface 314. A flange 320 is formed around the circumference of the backing plate 310 near the undersurface 314. The edge of the flange 320 is welded to the edge of the metal plate 194 along the entire periphery so that the top surface of the metal plate 194 is normally in contact with the undersurface 314 of the backing plate 310.

A plurality of screw holes (not shown) are formed to the backing plate 310 from the upper surface at positions corresponding to the through holes 172 formed in the upper heating platen 302. The backing plate 310 is fastened to the upper heating platen 302 by bolts (not shown) passed through the through holes 172 and then screwed into the screw holes. When the backing plate 310 is fastened to the upper heating plate 302, the top surface 312 of the backing plate 310 is in contact with the undersurface of the upper heating platen. Accordingly, the upper heating platen 302 can heat the backing plate 310 efficiently.

As shown in FIG. 7, the undersurface 312 of the backing plate 310 is provided with a groove 322 formed in a grid pattern and extending substantially all over the undersurface 312. A pressure conduit 324 is also formed in the backing plate 310 that connects the groove 322 with an opening 326 formed at one of the side surfaces of the backing plate 310 (see also FIG. 8).

The pressure conduit 324 is connected with the pressure generator 202 (see FIG. 5) via the opening 326 formed at the side surface of the backing plate 310. The pressure generator 202 provides the heat transfer oil to the grid patterned groove 322 through the pressure conduit 324 and also controls the pressure thereof.

Since the metal plate 194 is normally in contact with the undersurface of the backing plate 310 and there is no space other than the groove 322 therebetween, the heat transfer oil provided through the pressure conduit 324 flows mainly through the groove 322 and thereby spreads quickly over the metal plate 194.

The pressure conduit 324 includes four vertical holes 330 bored from the undersurface 312 of the backing plate 310. The pressure conduit 324 also includes an annular portion 332 that is in communication with the four vertical holes 330 and also with a lateral hole 334 extending from the opening 326 formed at the side of the backing plate 310. The four vertical holes 330 are formed at locations corresponding to the outermost corners of the grid pattern groove 322 such that the heat transfer oil provided to the groove 322 is spread quickly and uniformly all over the groove 322.

If the pressure generator 202 pressurizes the heat transfer oil after it has spread all over the groove 322, the pressurized heat transfer oil press the metal plate 194 away from the undersurface 312 of the backing plate 310 and fills the space that has appeared between the metal plate 194 and the backing plate 310. As a result, a liquid layer of the heat transfer oil is formed between the metal plate 194 and the backing plate 310 that applies a uniform pressure across the metal plate 194.

It should be noted that the pressing device 300 according to the present embodiment does not have any conduit that extends from the upper heating platen 302 to the upper platen cover 306. Therefore, the pressing device 300 according to the present embodiment has less risk of oil leaking, and the upper platen cover 306 can mounted to and demounted from the upper heating platen 302 easily since no packing is required to be inserted therebetween.

It should be also noted that the lower heating platen 304 and the lower platen cover 308 have substantially the same structures and functions as that of the upper heating platen 302 and the upper platen cover 306, respectively. Therefore the above description related to the upper heating platen 302 and the upper platen cover 306 applies also to the lower heating platen 304 and the lower platen cover 308.

(Third Embodiments)

FIG. 9 schematically shows the configuration of a pressing device 400 according to a third embodiment of the invention which is a modification of the pressing device 300 according to the second embodiment of the invention.

The pressing device 400 according to the third embodiment differs from the pressing device 300 of the second embodiment in that the undersurface of the upper heating platen 302 and the top surface of the lower heating platen 304 are respectively covered by a top plate 402 and a carrier plate 404, both made of stainless steel, instead of the upper and lower platen covers 306, 308. Further, the pressing device 400 according to the third embodiment includes two cushion members 406 and one or more intermediate plates 408. Each intermediate plate is made of stainless steel and have mirror finished surfaces each of which surface roughness is within several aim. Apart from the above, the structure of the pressing device 400 according to the third embodiment is substantially same as that of the pressing device 300 according to the second embodiment.

According to the third embodiment of the invention, a plurality of the printed wiring boards 134 and a plurality of intermediate plates 408 are alternately stacked so that each printed wiring board 134 is sandwiched between two intermediate plates. Then the stack of the printed wiring boards 134 and the intermediate plates 408 is placed between the top plate 402 and carrier plate 404 in order to be simultaneously pressed by one pressing operation.

One of the cushion member 406 is placed between the top plate 402 and the uppermost intermediate plate 408 while the other cushion member 406 is placed between the carrier plate 404 and the lowermost intermediate plate 408. No spacer, however, is provided between the heating platens 302, 304 in the present embodiment. The cushion members 408 placed as above cancel, during pressing, the effect of undulation and/or inclination of the top plate 402 and the carrier plate 404 on the printed wiring boards 134, as will be described later.

FIG. 10 is a vertical sectional view of a part of the pressing device 400 of FIG. 9 showing the cushion member 406 pressing the stack of the printed wiring boards 134. The cushion member 406 has first and second metal plates 420, 422. Both first and second metal plates 420 and 422 are made of stainless steel, for example, and have mirror finished surfaces. The first and second metal plates 420, 422 are arranged in parallel with each other and joined to each other by welding the ends 424 along the entire periphery so that the space 426 therebetween is sealed from the exterior. The space 426 sealed as above is filled with heat transfer oil to form a liquid layer between the first and second plates 420, 422.

By the cushion member 406 configured as above, the pressing force from the top plate 402 is once applied to the liquid layer and then to the second metal plate 422. Since the pressure within a continuous liquid layer is same at any location, the liquid layer applies a uniform pressure over the second metal plate 422 even if the top plate 402, being in contact with the cushion member 406, has unevenness or inclination.

The second metal plate 422, in turn, applies a uniform pressure over the uppermost intermediate plate 408. In the same way, the other cushion member 406 placed between the lower heating platen 304 and the stack of printed wiring board 134 applies a uniform pressure over the lowermost intermediate plate 408. As a result the stack of the printed wiring board 134, and therefore each printed wiring board 134 therein, is pressed with a uniform pressure. Thus, each printed wiring board 134 are formed in a uniform thickness and the circuitry layers are firmly bonded with the prepreg layer all over the board.

It should be noted that the second metal plate 422 of the cushion member 406 and the intermediate plates 408 are formed of relatively thin metal sheets so that they bend along the surface of the printed wiring board 134 and thereby assure the application of uniform pressure all over the printed wiring board 134.

It should be also noted that the cushion members 406 does not disturb the heat transfer from the upper and lower heating platens 302, 304 to the stack of printed wiring board 134 since the cushion member 406 is filled with the heat transfer oil which has high heat conductivity. Therefore, the pressing device 400 according to the embodiment does not require a long time for heating and, as a result, for pressing the printed wiring board 134.

FIG. 11 is a vertical sectional view of a part of the pressing device 400 of FIG. 9 showing a cushion member 430 which is a variation of the cushion member 406 shown in FIG. 10.

The cushion member 406 shown in FIG. 11 has two metal plates 432, 434, e.g. stainless steel plates, that are arranged in parallel with each other. An annular frame 436 is placed between the two metal plates 432, 434 to keep them parallel to each other with a predetermined distance (e.g. several millimeters) therebetween.

The frame 436 is welded to the two metal plates 432, 434 at the entire upper and lower edges so that a space 440 defined inside the two metal plates 432, 434 and the frame 436 is sealed from the exterior. This space 440 is filled with heat transfer oil to form a liquid layer between the two metal plates.

The liquid layer cancels the surface unevenness and/or inclination of the top plate 402 pressing the cushion member 430 so that the cushion member 430 of FIG. 11 applies a uniform pressure to the upper most intermediate plate 408 like the cushion member 402 of FIG. 10. The liquid layer also realizes a good heat conductivity of the cushion member 430. Therefore, the cushion member of FIG. 11 does not hinder effective heating of the stack of the printed wiring board 134 during pressing.

It should be noted that the second metal plate 422 of the cushion member 406 shown in FIG. 10 can press the intermediate plate 408 with uniform pressure only at a relatively small area around the center thereof since the area near the edge, which is welded to the edge of the first metal plate, is curved upwards as is shown in FIG. 10. The second metal plate 434 of the cushion member 430 shown in FIG. 11, however, can press the intermediate plate 408 with uniform pressure at a lager area since the frame 436 keeps the second metal plates 432 substantially flat.

The present disclosure relates to the subject matter contained in Japanese Patent Applications No. P2001-263911, filed on Aug. 31, 2001, No. P2002-29479, filed on Feb. 6, 2002, and No. P2002-124290, filed on Apr. 25, 2002, which are expressly incorporated herein by reference in its entirety.

What is claimed is:

1. A device for pressing a workpiece comprising:
   a platen movable toward said workpiece to be pressed;
   a pressing plate provided between said platen and said workpiece for pressing said workpiece when said platen is moved toward said workpiece; and
   a liquid layer formed between said pressing plate and said platen for transferring force for pressing said workpiece to said pressing plate from said platen through said liquid layer.

2. The device according to claim 1, wherein said pressing plate is a thin plate bendable along the surface of said workpiece during the pressing of said workpiece.

3. The device according to claim 2, wherein the workpiece side of said pressing plate is a mirror finished surface.

4. The device according to claim 1, wherein said platen is a heating plate heated to a temperature sufficient to heat said workpiece to a temperature required for heat-pressing, and
   wherein said liquid layer is filled with heat transfer oil.

5. The device according to claim 1, wherein said pressing plate is detachably mounted to said platen.

6. The device according to claim 1, wherein said pressing plate is mounted to said platen such that a space is defined therebetween, and
   wherein said liquid layer is formed by filling said space with liquid.

7. The device according to claim 6, further comprising a pressure controller for controlling the pressure of said liquid filled in said space.

8. The device according to claim 7, further comprising,
   a spacer arranged to support the workpiece side of said platen to sustain said platen forced towards said workpiece, such that a clearance is defined between said pressing plate and said workpiece when said liquid layer is not pressurized, said clearance having a size small enough to allow said pressing plate to bend by the action of the liquid layer and press said workpiece when said liquid layer is pressurized by said pressure controller.

9. The device according to claim 8, wherein said pressure controller raises the pressure of said liquid such that said pressing plate bends and presses said workpiece only when said platen is sustained by said spacer.

10. The device according to claim 9, wherein said pressure controller raises the pressure of said liquid up to a predetermined level not greater than the maximum pressure the platen can apply.

11. The device according to claim 1, further comprising:
    a pressure controller for controlling the pressure of said liquid layer; and
    a backing plate joined to said pressing plate such that a space is defined therebetween, said space being filled with liquid to form said liquid layer, said backing plate being detachably mounted to said platen, said backing plate including a conduit being in communication with said space and an opening formed at a side surface of said backing plate, said opening being connected to said pressure controller.

12. The device according to claim 11, wherein said space is formed when said liquid is pressurized by said pressure controller to a predetermined level, while said space disappears and said pressing plate becomes in contact with said backing plate when the pressure of said liquid is reduced below said predetermined level by said pressure controller.

13. The device according to claim 11, wherein a groove is formed to said backing plate at the surface facing said pressing plate, said groove being formed in a grid pattern extending over said surface of said backing plate, said groove being in communication with said conduit to provide said liquid into said groove.

14. The device according to claim 11, wherein said platen is a heating platen heatable to a temperature sufficient to heat said workpiece to a temperature required for pressing, and
    said backing plate is mounted to said platen such that the surface facing said platen is in contact therewith.

15. The device according to claim 1, comprising:
    a pair of said platens:
    a pair of said pressing plates; and
    a pair of said liquid layers,
    wherein said platens, pressing plates and liquid layers are arranged to sandwich and press said workpiece between said pair of pressing plates.

16. The device according to claim 1, comprising:
    a cushion member including said pressing plate and an additional plate joined to said pressing plate to defined a sealed space therebetween, said sealed space being filled with liquid to form said liquid layer,
    wherein said cushion member is located between said platen and said workpiece so that said additional plate faces said platen and said pressing plate faces said workpiece.

17. The device according to claim 16, wherein said platen is a heating platen heatable to a temperature sufficient to heat said workpiece to a temperature required for pressing, and
    wherein said sealed space is filled with heat transfer oil to form said liquid layer.

18. The device according to claim 16, wherein said pressing plate and said additional plate are made of a material of high heat conductivity.

19. The device according to claim 18, wherein the workpiece side of said pressing plate is of a mirror finished surface.

20. The device according to claim 18, wherein said sealed space is formed by welding said pressing plate and said additional plate along the entire peripheries thereof.

21. The device according to claim 16, wherein said cushion member includes a spacer located between said pressing plate and said additional plate to keep said pressing plate substantially flat.

22. The device according to claim 21, wherein said spacer is an annular member having an upper rim and a lower rim, said upper and lower rims being respectively welded to said pressing plate and said additional plate to form said sealed space.

23. The device according to claim 16, comprising:
    a pair of said platens, and
    a pair of said cushion members,
    wherein said platens and cushion members are arranged to sandwich and press said workpiece between said pair of cushion members.

24. The device according to claim 23, further comprising a flat intermediate plate, said intermediate plate being located to one of first and second spaces while said workpiece is pressed, said first space being defined between said workpiece and said cushion member, said second space being defined between two workpieces stacked to be pressed simultaneously.

25. The device according to claim 24, wherein said intermediate plate is thin enough to bend along the surface of said workpiece when said intermediate plate is pressing said workpiece.

26. The device according to claim 25, wherein said intermediate plate is made of a material of high heat conductivity.

27. A cushion member to be located between a platen of a press and a workpiece to be pressed, comprising:

first and second plates joined to each other to define a sealed space therebetween, said sealed space being filled with liquid; and a spacer located between said first and second plates to keep said first and second plates substantially flat and parallel to each other, wherein said spacer is an annular member having an upper rim and a lower rim, said upper and lower rims being respectively welded to said first and second plates to form said sealed space.

28. The cushion member according to claim 27, wherein said sealed space is formed by welding said first and second plates along the entire peripheries thereof.

29. The cushion member according to claim 27, wherein said first and second plates are made of a material of high heat conductivity.

30. The cushion member according to claim 27, wherein said sealed space is filled with a heat transfer oil.

* * * * *